United States Patent
Shimizu et al.

(10) Patent No.: US 6,468,403 B1
(45) Date of Patent: Oct. 22, 2002

(54) METHODS FOR PRODUCING FUNCTIONAL FILMS

(75) Inventors: Junichi Shimizu; Shujiro Watanabe; Satoru Takaki; Hisashi Osaki; Takuji Oyama, all of Yokohama; Eiichi Ando, Ibaraki-ken, all of (JP)

(73) Assignee: Asahi Glass Company Ltd., Tokyo (JP)

( * ) Notice: Subject to any disclaimer, the term of this patent is extended or adjusted under 35 U.S.C. 154(b) by 0 days.

(21) Appl. No.: 08/281,573

(22) Filed: Jul. 28, 1994

(30) Foreign Application Priority Data

Jul. 28, 1993 (JP) .............................. 5-205704
Apr. 18, 1994 (JP) .............................. 6-078731

(51) Int. Cl.⁷ .............................................. C23C 14/34
(52) U.S. Cl. ............................ 204/192.29; 204/192.22; 204/192.23
(58) Field of Search ................. 204/192.15, 192.17, 204/192.18, 192.2, 192.22, 192.23, 192.26, 192.27, 192.28, 192.29, 298.08

(56) References Cited

U.S. PATENT DOCUMENTS

| | | | | |
|---|---|---|---|---|
| 4,014,772 A | * | 3/1977 | Woods et al. ........... | 204/192.22 |
| 4,281,208 A | * | 7/1981 | Kuwano et al. .......... | 204/192.3 |
| 4,683,044 A | * | 7/1987 | Shimizu et al. .......... | 204/192.26 |
| 4,849,081 A | * | 7/1989 | Ross ...................... | 204/192.23 |
| 4,880,661 A | * | 11/1989 | Endo et al. ............... | 204/192.1 |
| 4,885,068 A | * | 12/1989 | Uramoto et al. ......... | 204/192.11 |
| 5,015,493 A | * | 5/1991 | Gruen ..................... | 427/571 |
| 5,180,476 A | * | 1/1993 | Ighiboshi et al. ....... | 204/298.08 |
| 5,240,581 A | * | 8/1993 | Kim ....................... | 204/192.26 |
| 5,279,722 A | * | 1/1994 | Szczyrbowski et al. ... | 204/192.27 |
| 5,286,360 A | * | 2/1994 | Szczyrbowksi et al. ... | 204/298.08 |

FOREIGN PATENT DOCUMENTS

| | | |
|---|---|---|
| EP | 0 385 475 | 9/1990 |
| EP | 0 421 015 | 4/1991 |
| EP | 0 445 535 | 9/1991 |
| EP | 0 447 850 | 9/1991 |
| EP | 0 502 242 | 9/1992 |
| GB | 2 196 021 | 4/1988 |
| JP | A-59-29304 | 2/1984 |
| JP | B2-61-28615 | 7/1986 |
| JP | B2-62-38432 | 8/1987 |
| JP | 01015370 | 1/1989 |

OTHER PUBLICATIONS

"Kathodenzerstäuben, Beschichtungsmethode mit Aukunft", Von Hartmut Frey, Stuttgart, vol. −z 123 (1981) Nr 12—Juni (II), pp. 519–525.

Jia et al.; "BaTiO₃ Thin Film Capacitors Deposited By R.F. Magnetron Sputtering"; Thin Solid Films; vol. 209, No. 2, Mar. 30, 1992, pp. 230–239; XP000362009.

* cited by examiner

Primary Examiner—Rodney G. McDonald
(74) Attorney, Agent, or Firm—Oblon, Spivak, McClelland, Maier & Neustadt, P.C.

(57) ABSTRACT

A method for producing a transparent conductive film composed mainly of an oxide by sputtering using a sputtering target capable of forming a transparent conductive film, wherein intermittent electric power is supplied to the target.

9 Claims, 7 Drawing Sheets

METHODS FOR PRODUCING FUNCTIONAL FILMS

The present invention relates to a method for producing a transparent conductive film, whereby a transparent conductive film useful for e.g. a transparent electrode film for a liquid crystal display, a plasma display, an EL display, a touch panel or an anti-fogging glass for vehicles, or. an optical thin film useful for a building window having various optical properties, is formed by sputtering.

The present invention also relates to a method for forming a silicon oxide film having an alkali barrier property or a silicon nitride film having various functions.

As a method for forming the above transparent conductive film, there has been proposed a chemical film-forming method such as a sol-gel coating method, a spraying method or: a chemical vapor deposition (CVD) method, or a physical film-forming method such as a vacuum deposition method or a sputtering method.

However, for the industrial production of such transparent electrode films, the physical film-forming method such as a vacuum evaporation method or a sputtering method has been mainly employed for the reason that a transparent conductive film excellent in electrical properties and optical properties can thereby be readily obtained. Especially, in recent years, the sputtering method has been widely used for the-reason that a film can be formed uniformly on a substrate having a large area, and yet the film can be constantly formed even on a relatively low temperature substrate.

The sputtering method is a film-forming method, wherein argon gas is ionized by direct current (DC) discharge or radio frequency (RF) discharge and bombarded to a negatively biased metal or oxide target, and the substance sputtered from the target is precipitated on a substrate.

For example, when a tin oxide film is to be formed, tin oxide containing from 0.1 to 10 wt % of antimony or a tin alloy containing from 0.1 to 10 wt % of antimony may be used as the target material.

Likewise, when an ITO film is to be formed, indium oxide containing from 5 to 10 wt % of tin oxide (ITO target) or an indium-tin alloy containing from 5 to 10 wt % of tin (IT target) may, for example, be used as the target material.

Likewise, when a zinc oxide film is to be formed, zinc-oxide containing from 0.1 to 10 wt % of aluminum, zinc oxide containing from 0.1 to 15 wt % of gallium, a zinc alloy containing from 0.1 to 10 wt % of aluminum, or a zinc alloy containing from 0.1 to 15 wt % of gallium, may, for example, be used as the target material.

As the sputtering gas, an inert gas such as argon, which may contain oxygen, as the case requires, may be employed.

However, when the conventional sputtering method is used for the production of a transparent conductive film, in either case of using an oxide target or a metal target as the target material, there has been a problem such that during continuous sputtering, black fine protrusions (so-called nodules).which are believed to be a sub oxide having a remarkably poor sputtering rate as compared with the target material, are formed on the target surface, whereby the deposition rate of the transparent conductive film tends to gradually decrease, and at the same time arcing tends to occur frequently, whereby the target material spitted by the arcing is likely to deposit on the substrate and form defects of the transparent conductive film.

For example, if continuous sputtering is carried out for a long period of time by using a tin oxide target having a thickness of 6 mm, the deposition rate of tin oxide will decrease to a level of from 60 to 70% of the initial rate and at the same time, the frequency of arcing sharply increases, immediately prior to the completion of the use of the target.

Accordingly, in an industrial mass production process, it is common to gradually increase the sputtering electric power or gradually prolonging the deposition time, as the deposition rate decreases, to cope with the problem by experience. When the arcing frequency or the decrease of the deposition rate is especially remarkable, it is common to open the apparatus to the atmospheric air and to mechanically scrape off the nodules.

On the other hand, it has been known that formation of nodules can be suppressed by sputtering with a large electric power density. However, if the power density is increased, arcing occurs more frequently, and once such arcing occurs, the damage is likely to be more substantial.

With the above-mentioned target which is capable of forming a transparent conductive film, the target is likely to undergo cracking due to inadequate cooling of the target. Further, the sputtering speed tends to be high, whereby the film properties of the transparent conductive film tend to be poor.

To solve the above problems, it has been proposed to conduct cleaning for removal of the above nodules by plasma using nitrogen or a gas having a nitrogen component, as disclosed in Japanese Unexamined Patent Publication No. 293767/1992. This method has a merit that cleaning can be conducted without opening the apparatus to the atmospheric air, but it also has drawbacks such that, to conduct the above cleaning, the sputtering of transparent conductive oxide has to be once stopped, and if formation of nodules is remarkable, such nodules can not be completely removed even if cleaning is carried out for a long period of time.

It is an object of the present invention to provide a method for producing a transparent conductive film excellent in the productivity, which does not require cleaning by plasma or mechanical cleaning under the atmospheric air and whereby the above-mentioned conventional problems such as formation of nodules, generation of arcing and decrease of the deposition rate, can be solved.

In a liquid crystal display which has been rapidly progressed in recent years, it is known that alkali metal ions such as $Na^+$ or $K^+$ contained in the substrate glass diffuse through various thin layers formed on the surface of the glass substrate during the assembling process of the liquid display cell or during the use for a long period of time and reach the liquid crystal layer to deteriorate the performance of the device. Further, if such alkali metal ions reach the transparent conductive film such as ITO formed on the glass substrate, they deteriorate the electrical conductivity, which in turn deteriorates the response of the liquid display device or the quality of the Display. Therefore, when soda lime glass produced by a float method is to be used as the substrate for a liquid crystal display cell, it has been common to form a thin film of silica of a few tens nm as the first layer on the glass to let it have an alkali barrier property.

The ability to prevent the diffusion of alkali metals (i.e. the alkali barrier property) depends largely on the nature of the material to be used, and not only that, when a certain material is selected, the alkali barrier property depends largely on the density of microscopic defects or the impurity concentration in the material.

On the other hand, it is commonly known that if the substrate temperature is increased, the density of the thin film deposited on the substrate increases, and the density of the microscopic defects decreases. Accordingly, it is common to conduct film deposition on the heated substrate in order to obtain a thin film having a high alkali barrier property.

For these reasons, silica has been used frequently as a material for the alkali barrier film to prevent diffusion of alkali metals, and it has been common to conduct film deposition on the heated substrate, at a high temperature in order to obtain a high level of the alkali barrier property. Therefore, the substrate has been limited to a material having heat resistance.

The film-forming method may, for example, be a dipping method, a CVD method, an EB evaporation method or a sputtering method. From the viewpoint of costs and performance, the CVD method or the sputtering method is selected in many cases. As the CVD method, a so-called pyrolytic CVD method is employed, whereby the substrate temperature tends to be naturally high, whereby the restriction relating to the heat resistance of the substrate is rather severe.

On the other hand, in the sputtering method, it is basically unnecessary to raise the substrate temperature. However, in order to improve the alkali barrier property as mentioned above, or to reduce the specific resistance of the transparent conductive film during the subsequent sputtering process of the transparent conductive film, it is common to raise the substrate temperature to a level of at least 300° C. From the viewpoint of the compatibility to such a process, it is usual to raise the substrate temperature to a level of about 300° C.

Further, as a sputtering technique, it has been believed difficult to sputter Si stably by reactive sputtering. Therefore, it has been common to employ RF sputtering using a $SiO_2$ target.

However, with RF sputtering, it has been believed difficult to apply large electric power or to form a film over a large area, and with a sputtering apparatus of a large scale, there has been a problem in the uniformity or in the deposition rate. Accordingly, it has been common to study the possibility of forming a $SiO_2$ film at a high speed by DC sputtering which is believed relatively easy to apply for a large scale apparatus.

Accordingly, it is an object of the present invention to provide a method for forming a silicon oxide film having a sufficient alkali barrier property stably and yet at a low temperature by DC sputtering.

On the other hand, it has been found that silicon nitride may have an alkali barrier property equal or superior to that of silica. However, a so-called CVD method which comprises decomposing a molecular gas containing silicon and a molecular gas containing nitrogen by an exciting means such as heat or plasma and then reacting them to obtain silicon nitride, has a problem that the substrate temperature tends to be high during the film-forming operation. Further, it has a problem that during this film-forming operation, alkali metals from the substrate tend to diffuse into the silicon nitride film to deteriorate the alkali barrier property.

On the other hand, a so-called radio frequency sputtering method wherein silicon nitride or silicon is used as the target, and a silicon nitride film is formed by applying a radio frequency voltage to the target, has a problem that the deposition rate is low, and if input power is increased to improve the deposition rate, the temperature of the substrate increases, and electrons or negative ions bombard the substrate to cause damage and to let many defects form also in the growing silicon nitride film, whereby the alkali barrier property tends to be poor.

As described in the foregoing, with the conventional method for forming a silicon nitride film, it has been difficult to obtain silicon nitride having a sufficient alkali barrier property for the reason that the substrate temperature increases and so on, and it has been difficult to form a film stably at a high speed.

Accordingly, it is an object of the present invention to provide a method for forming a silicon nitride film having a sufficient alkali barrier property stably and yet at a low temperature by DC sputtering.

Further, several different methods are available for preventing permeation of moisture. Among them, however, it is usual to employ a method of laminating a thin film of an organic material having a low water permeability or a method of forming a: film of e.g. a metal as a protective layer on the material to be protected from moisture.

Among the above conventional methods for preventing permeation of moisture, the thin film of an organic material has a problem in the weather resistance because of deterioration due to ultraviolet rays. In the case where a metal is employed as the protective layer, the reflectance and the absorption coefficient of metal are generally large. Accordingly, such a metal can not be used in a case where a high level of optical transmittance is required.

The present inventors have found that the silicon nitride film has high water permeation resistance, excellent mechanical and chemical stability, and high transparency, which are very suitable properties for a protective layer. Further, by using a reactive DC sputtering method, a protective layer having a uniform thickness and uniform film quality can be formed at a high speed even for a substrate with a large area (Japanese Patent Application No. 184519/1993).

However, by a conventional reactive DC sputtering method, the resulting silicon nitride film is likely to change by a slight change in the deposition condition, and it has been difficult to form a silicon nitride film stably as designed.

Accordingly, it is an object of the present invention to provide a method for producing a silicon nitride film having a sufficient water permeation resistance stably by DC sputtering.

The silicon nitride film is useful also as an oxidation-resistant protective film (Japanese Unexamined Patent Publication No. 213632/1993).

As mentioned above, various methods are available for forming films of silicon nitride. However, the conventional CVD method has a drawback that the temperatures of the substrate and the material to be protected from oxidation will rise, whereby the substance to be protected from oxidation is likely to react. On the other hand, the conventional radio frequency sputtering method has a drawback that the substance to be protected is likely to be damaged by the bombardment of electrons or negative ions, and it is difficult to apply large electric power by a RF power source in order to accomplish the protection of a large area. Under the circumstances, the reactive DC sputtering method is being recognized as the best film-forming method.

However, as described above, with the conventional reactive DC sputtering method, the silicon nitride film is likely to be changed by a slight change of the condition, and it has been difficult to form a silicon nitride film stably as designed.

Accordingly, it is an object of the present inventions to provide a method for forming a silicon nitride film having a sufficient oxidation resistance stably by DC sputtering.

According to the first aspect, the present invention provides a method for producing a transparent conductive film composed mainly of an oxide by sputtering using a sputtering target capable of forming a transparent conductive film, wherein intermittent electric power is supplied to the target.

According to the second aspect, the present invention provides a method for forming a silicon oxide film having an alkali barrier property on a substrate by sputtering using an oxygen-containing gas as the sputtering gas and a sputtering target composed mainly of silicon, wherein intermittent negative voltage is applied to the target.

According to the third aspect, the present invention provides a method for forming a silicon nitride film on a substrate by sputtering using a nitrogen-containing gas as the sputtering gas and a sputtering target composed mainly of silicon, wherein intermittent negative voltage is applied to the target.

Now, the present invention will be described in detail with reference to the preferred embodiments.

According to the first aspect, the present invention provides a method for producing a transparent conductive film composed mainly of an oxide by sputtering using a sputtering target capable of forming a transparent conductive film, wherein intermittent electric power is supplied to the target.

As the sputtering target, a sputtering target composed essentially of tin or tin oxide, a sputtering target composed essentially of indium or indium oxide, or a sputtering target composed essentially of zinc or zinc oxide, may, for example, be mentioned.

When the sputtering target is composed essentially of tin or tin oxide, it preferably contains metal antimony or an antimony compound, since it is thereby possible to improve the electrical conductivity. The content thereof is preferably from 0.1 to 10 wt %.

When the sputtering target is composed mainly of indium or indium oxide, it preferably contains tin, since it is thereby possible to improve the electrical conductivity. The content thereof is preferably from 5 to 10 wt %.

When the sputtering target is composed mainly of zinc or zinc oxide, it preferably contains a simple substance or a compound of at least one metal selected from the group consisting of aluminum, gallium, indium, boron and silicon, since it is thereby possible to improve the electrical conductivity. The content thereof is preferably from 0.1 to 15 wt %. Particularly preferred is the one which contains from 0.1 to 10 wt % of aluminum or from 0.1 to 15 wt % of gallium.

Figure 1:
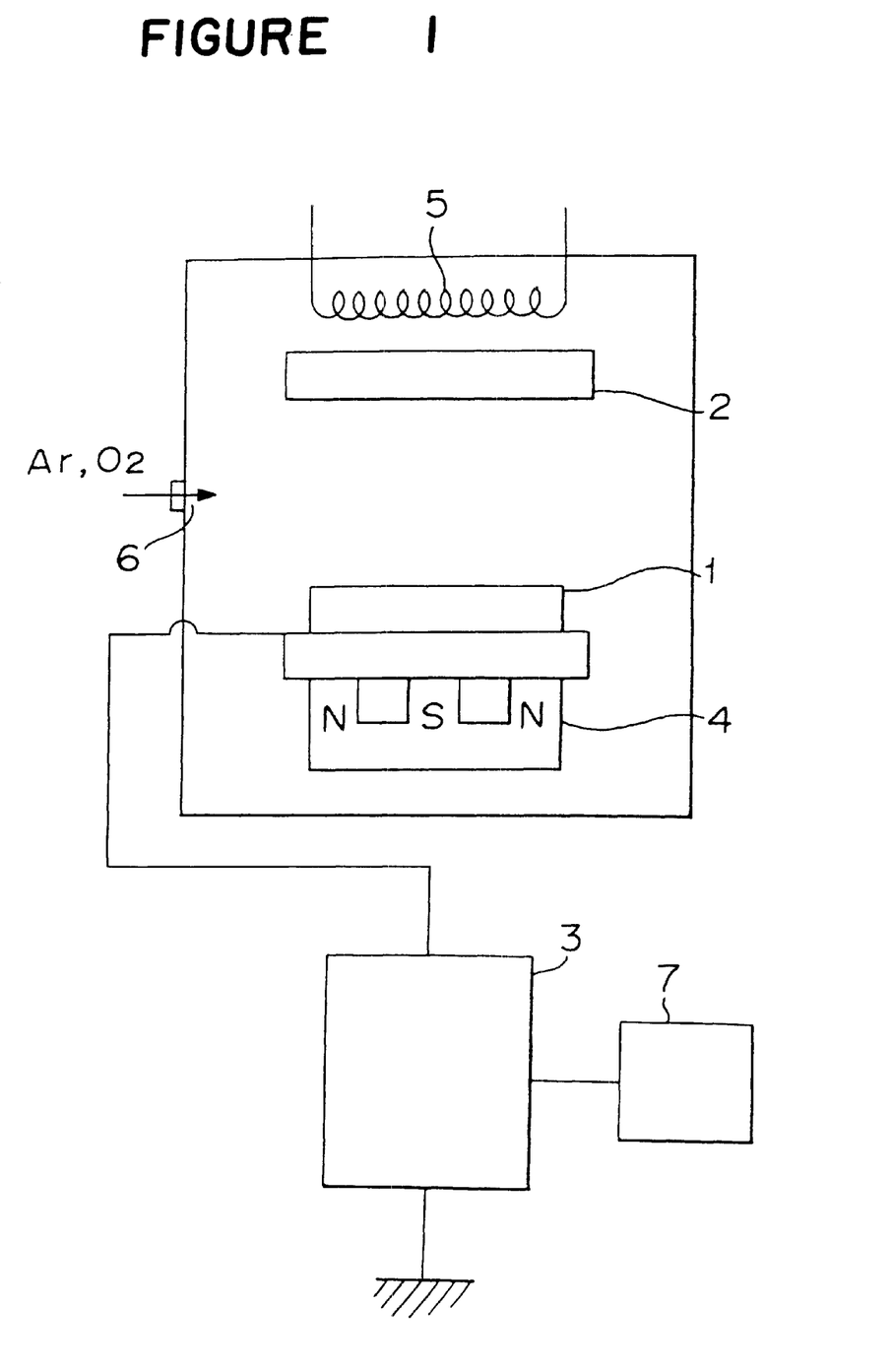
FIG. 1 is a schematic cross-sectional view of a sputtering apparatus useful for the present invention.

FIG. 1 is a schematic cross-sectional view of a film-forming apparatus according to the present invention. Reference numeral 1 indicates a sputtering target, numeral 2 a substrate on which a thin film is to be formed, numeral 3 a sputtering power source, numeral 4 a magnet for magnetron sputtering, numeral 5 a heater for heating the substrate, numeral 6 an inlet for sputtering gas, and numeral 7 a control means for supplying intermittent electric power.

Figure 2:
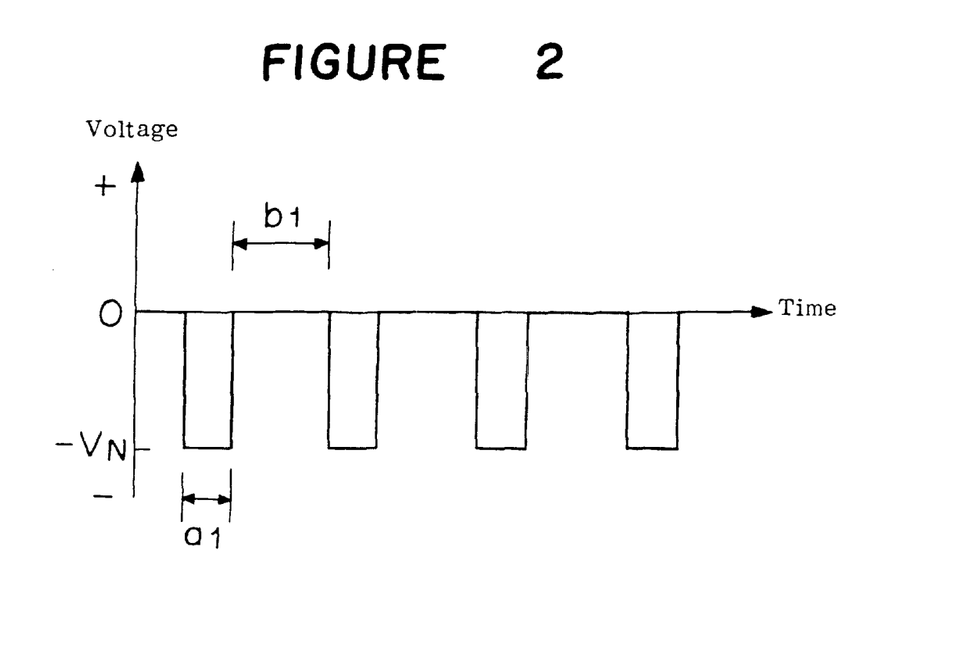
FIG. 2 is a graph showing a voltage waveform of a sputtering power source to be used in the present invention.
Figure 3:
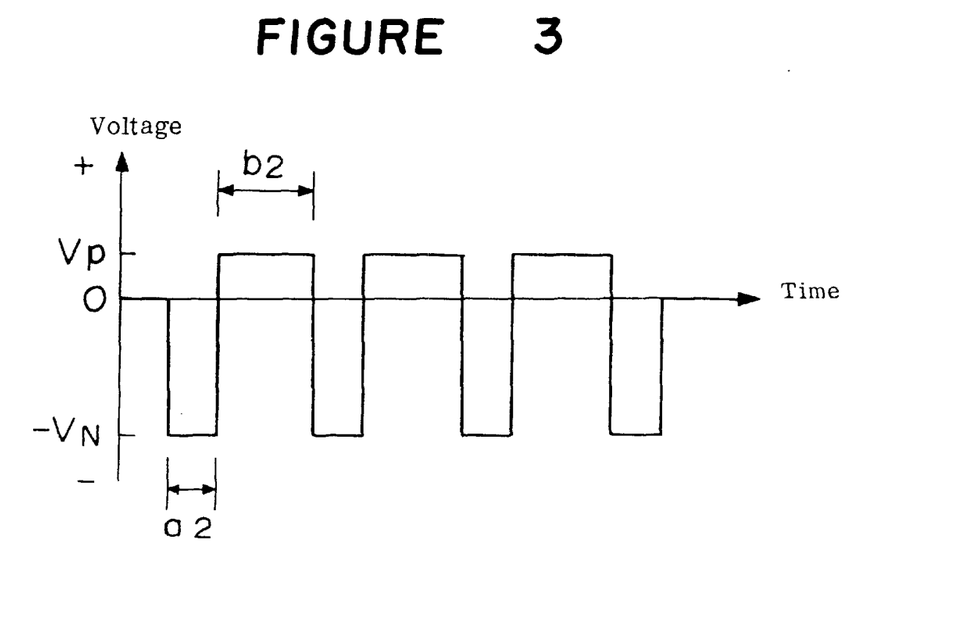
FIG. 3 is a graph showing another voltage waveform of a sputtering power source to be used in the present invention.
Figure 4:
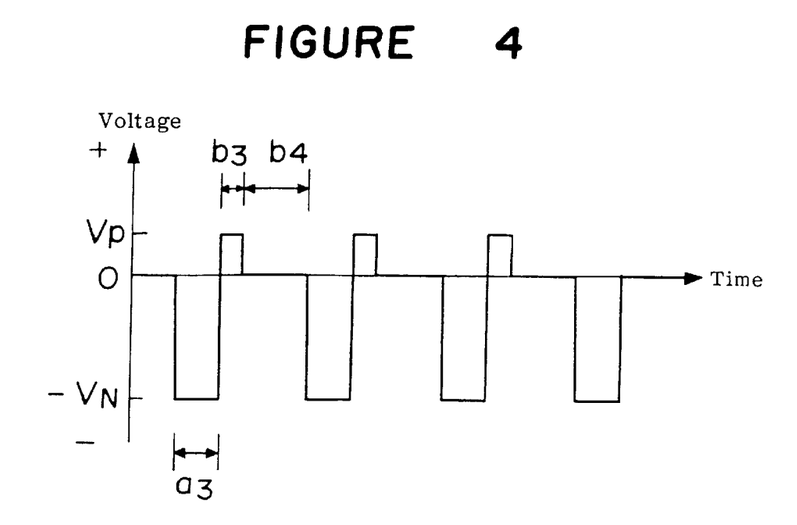
FIG. 4 is a graph showing still another waveform of a sputtering power source to be used in the present invention.

The sputtering power source to be used in the present invention is not particularly limited, so long as it is capable of supplying intermittent electric power. Preferred is the one which is capable of supplying the voltage waveform as shown in FIG. 2, wherein the application time $a_1$ of negative voltage is within a range of from 10 µs to 10 ms, and non-application time $b_1$ is within a range of from 10 µs to 100 ms, the one capable of supplying the voltage waveform as shown in FIG. 3 wherein the application time $a_2$ of negative voltage is within a range of from 10 µs to 10 ms, and the application time $b_2$ of positive voltage is within a range of from 10 µs to 100 ms, or the one capable of supplying the voltage waveform as shown in FIG. 4 wherein the application time $a_3$ of negative voltage is within a range of from 10 µs to 10 ms, and the sum of the application time $b_3$ of positive voltage and non-application time $b_4$, is within a range of from 10 µs to 100 ms.

Further, setting of the value of negative applied voltage $(-V_N)$ is important for suppressing formation of nodules, which is an object of the present invention. Preferred effects can be obtained by adjusting the negative applied voltage $(-V_N)$ so that the average value $W_A$ of the intermittently supplied electric power will be from 2 to 10 times the average value W of the electric power per period (hereinafter referred to as the effective value W).

The effective value W of the electric power will be as represented by the formula 1, where T is the period. If this is applied to the case of the waveform as shown in FIG. 2, W will be as shown by the formula 2.

On the other hand, the average electric power $W_A$ during the time when sputtering actually takes place (when the negative voltage is applied) ($a_1$ in FIG. 2) will be as shown by the formula 3. Further, in FIG. 2, the applied voltage during the time $a_1$ is $(-V_N)$, and if this is inserted, $W_A$ will be as shown by the formula 4.

To effectively remove nodules, it is preferred that the average value $W_A$ of electric power will be from 2 to 10 times the effective value W of the electric power, as shown by the formula 5. If this is applied to the case of the waveform as shown in FIG. 2, the formula 6 will be obtained. Therefore, $(-V_N)$, $a_1$ (10 µs $\leq a_1 \leq$ 10 ms), and $b_1$ (10 µs $\leq b_1 \leq$ 100 ms) should be adjusted to satisfy the formula 6.

Good results can be obtained especially when the average value of intermittent electric power density $W_A$ (formula 7) is within a range of from 2.5 W/cm² to 30 W/cm².

In this case, the waveform may not be necessarily be a precise rectangular waveform as shown in FIG. 2, and $(-V_N)$, $a_1$ and $b_1$ may be optimized depending upon the size and condition of the target and the particular apparatus.

In a case where positive voltage is applied as shown in FIG. 3 or 4, application of such positive voltage does not work effectively for sputtering, and accordingly, in the calculation of formulas 1 to 7, $v_p$ is to be taken as 0.

The deposition rate of the transparent conductive film can easily be controlled by the effective value W of the intermittently supplied sputtering electric power. For example, in a case where by the method of the present invention, it is intended to obtain the deposition rate equal to the conventional DC sputtering method, the desired deposition rate can be obtained by adjusting the effective value W of the intermittently supplied electric power to the same level as the DC electric power value.

Namely, an equation of "the deposition rate by the conventional DC sputtering method/the DC electric power= the deposition rate according to the present invention/the effective value W of electric power" substantially holds good.

The power source to be used in the present invention is not particularly limited so long as it is capable of supplying intermittent electric power. Further, there is no particular restriction as to other constituting elements such as a sputtering cathode and a sputtering magnet, and a conventional sputtering apparatus can be used.

$$W = \frac{1}{T}\int_0^T V(t)I(t)\,dt \qquad \text{Formula 1}$$

$$W = \frac{(-Vn)}{a_1+b_1}\int_0^{a_1} I(t)\,dt \qquad \text{Formula 2}$$

$$W_A = \frac{1}{a_1}\int_0^{a_1} V(t)I(t)\,dt \qquad \text{Formula 3}$$

$$W_A = \frac{-V_N}{a_1}\int_0^{a_1} I(t)\,dt \qquad \text{Formula 4}$$

$$2W \leq W_A \leq 10W \qquad \text{Formula 5}$$

$$2 \leq \frac{W_A}{W} = \frac{a_1+b_1}{a_1} \leq 10 \qquad \text{Formula 6}$$

$$\omega_A = \frac{W_A}{S} \quad S : \text{Target surface area} \qquad \text{Formula 7}$$

The present invention has an excellent feature that by supplying intermittent sputtering electric power, formation of nodules on the surface of the target can be suppressed without stopping the sputtering process. Namely, it has an excellent effect that by intermittently stopping the supply of sputtering electric power or supplying positive voltage for 10 µs or more, the electric charge accumulated on the target surface which causes arcing, can be extinguished.

However, stopping of the supply of sputtering electric power or application of positive voltage for more than 100 ms, is not desirable for the reason that such will leads to deterioration of the sputtering rate, and non-uniformity in the film thickness or in the film quality is likely to occur in the moving direction of the substrate in the case of an in-line apparatus wherein the substrate passes in front of the target at a predetermined transportation speed.

Therefore, in order to obtain the effects of the present invention sufficiently, it is preferred that the voltage waveform of the sputtering electric power is within such a range that the sum of non-application time and the application time of positive voltage is within a range of from 10 µs to 100 ms.

Further, the average value $W_A$ of the intermittently supplied electric power can be made to be several times the corresponding electric power of DC sputtering.

For example, if the ratio of the application time $a_1$ to the no-application time $b_1$ of the sputtering electric power in FIG. 2 is 1:1, $W_A$ will be about twice as large as the corresponding DC sputtering power, and if the ratio is 1:4, $W_A$ will be about 5 times as large as the corresponding DC sputtering power. This brings an important effect for suppressing formation of nodules.

Namely, this brings an excellent effect such that sputtering is carried out instantaneously by a large electric power density, whereby nuclei responsible for formation of nodules or nodules themselves will be removed by sputtering. To obtain such an effect effectively it is necessary to instantaneously supply a large electric power density required for suppressing formation of nodules. Accordingly, as the voltage waveform to be applied to the target, it is preferred that the application time of negative voltage is within a range of from 10 µs to 10 ms.

Further, the value of negative applied voltage is preferably set so that the average value $W_A$ of intermittently supplied electric power will be from 2 to 10 times the effective value W of the electric power. If the average value is less than twice, the sputtering electric power density $W_A$ is too small to extinguish nodules by sputtering On the other hand, if it exceeds ten times, arcing tend s to be frequented.

Especially good results can be obtained when the average value of intermittent electrical power density $\omega_A$ is within the range of, from 2.5 W/cm² to 30 W/cm².

Further, the present invention provides a merit such that arcing can be prevented at a higher effective electric power value for sputtering as compared with conventional DC sputtering by stopping the supply of sputtering electric power or by application of positive voltage, whereby high speed sputtering can be realized.

Furthermore, the present invention provides a merit that the sputtering rate of the present invention can readily be controlled by the effective value of the intermittently supplied electric power waveform. For example, in order to attain the rate equal to the sputtering rate of conventional DC sputtering, the effective value of the intermittently supplied electric power W in the present invention may be adjusted to the DC power value.

According to the second aspect, the present invention provides a method for forming a silicon oxide film having an alkali barrier property on a substrate by sputtering using an oxygen-containing gas as the sputtering gas and a sputtering target composed mainly of silicon, wherein intermittent negative voltage is applied to the target.

The substrate to be used in the present invention is not particularly limited, but a substrate for a transparent electrode made of glass containing an alkali component such as soda lime glass, particularly a substrate for a liquid crystal display, may be mentioned as a preferred example.

As the target in the present invention, the one having electrical conductivity to some extent is preferred so that DC sputtering may be employed. For this purpose, it is preferred to employ phosphorus (P) or boron (B) doped single crystal or polycrystal silicon (Si). Sintered Si containing iron (Fe) and others as impurities, or Si target formed by plasma spray coating, may also be employed. However, the present invention is not limited to such specific materials.

As the sputtering gas in the present invention, it is necessary to employ gas containing oxygen ($O_2$) to obtain a silicon oxide film. As a specific example, it is possible to employ oxygen only or a gas mixture of argon (Ar) and oxygen. Further, another oxidating gas such as nitrous oxide ($N_2O$) or nitrogen monoxide (NO) may be incorporated as a component of the gas mixture. Another inert gas such as He or Ne may, for example, be incorporated as a component of the gas mixture. The present invention is not limited to the gas compositions hereby exemplified.

In the present invention, the voltage applied to the cathode may be any voltage so long as it is intermittent negative voltage. However, it is preferably periodically repeated intermittent negative voltage of from 1 to 100 kHz.

For example, a method may be mentioned wherein negative voltage is applied for a certain period and then the voltage is turned to zero for an another certain period, and this is periodically repeated. It is particularly preferred to apply positive DC voltage during part of the time when the negative voltage is not applied, with a view to preventing arcing.

If arcing occurs, fine particles are spitted from the surface of the target and will deposit on the substrate to form flaws. The flaws affect the property of a, transparent conductive film to be subsequently formed, or are likely to bring about a failure in subsequent patterning process of to the transparent conductive film. When such particles are removed from the substrate, pin holes will be formed, which again are likely to bring about patterning failure or act as a diffusion path of alkali ions from the substrate to cause operational failure of a liquid crystal device.

It is believed that the intermittent negative voltage with a frequency of from 1 to 100 kHz to be used in the present invention serves to neutralize the charge up of the highly insulating silicon oxide film attached along the peripheral portion of the eroded area of the target by back scattering and thus serves to prevent arcing. Namely, it is believed that by the periodic non-application or by the periodic application of positive voltage, electrons in the after-glow will flow into-the insulating film portion and neutralize the positive charge accumulated in the insulating film portion. A thin film composed mainly of silicon oxide thus formed on a substrate, will be of high quality, since little arcing takes place during the sputtering process so that deposition of the spitted particles will be little. Further, it is believed that since there is no fluctuation in the deposition condition due to arcing, a uniform film with little microscopic defects can be obtained. Further, it is believed that excellent film quality can be obtained, since sputtering is carried out intermittently, whereby a very thin film is intermittently formed on the substrate with an interval, and an oxidation reaction on the substrate is completed during every period.

Thus, it is possible to obtain an excellent thin film composed mainly of silicon oxide which has little defects macroscopically or microscopically, whereby a good alkali barrier property can be obtained even when the film is formed on a low temperature substrate.

According to the third aspect, the present invention provides a method for, forming a silicon nitride film on a substrate by sputtering using a nitrogen-containing gas as the sputtering gas and a sputtering target composed mainly of silicon, wherein intermittent negative voltage is applied to the target.

As the target in this invention, the one described above may be employed.

Sputtering is carried out by applying negative voltage intermittently to the silicon target, whereby the temperature rise of the substrate can be suppressed, diffusion of alkali atoms into silicon nitride during the deposition can be reduced, and deterioration of the alkali barrier property due to impurities in silicon nitride can be prevented.

Figure 6:
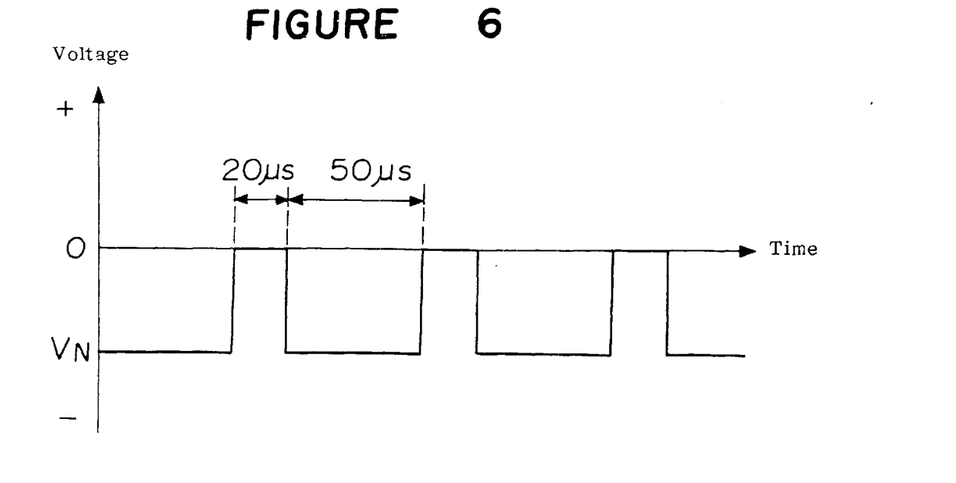
FIG. 6 is a graph showing a still further voltage waveform of a sputtering power source to be used in the present invention.

As shown in FIG. 6, if the voltage is 0 during the time when negative voltage $V_N$ is not applied, sputtering stops during the 0 voltage.

In such a state, supply of silicon atoms from the target to the substrate stops, and only nitriding takes place on the surface of silicon nitride being formed on the substrate. As a result, as compared with the case where sputtering is conducted by applying voltage continuously to the :target, bonding of nitrogen atoms to non-bonded silicon atoms remaining in the silicon nitride film is promoted, whereby the number of atomic level defects of silicon nitride decreases, and the alkali barrier property, the water permeation resistance and the oxidation resistance: will be improved.

Further, it is believed that when the voltage is switched to 0, highly reactive positive ions of nitrogen which have been under restraint in the form of plasma in the vicinity of the silicon target, will be free from restraint and reach the substrate to promote the nitriding reaction and thus contribute to reduce the number of atomic level defects of the resulting silicon nitride.

Figure 5:
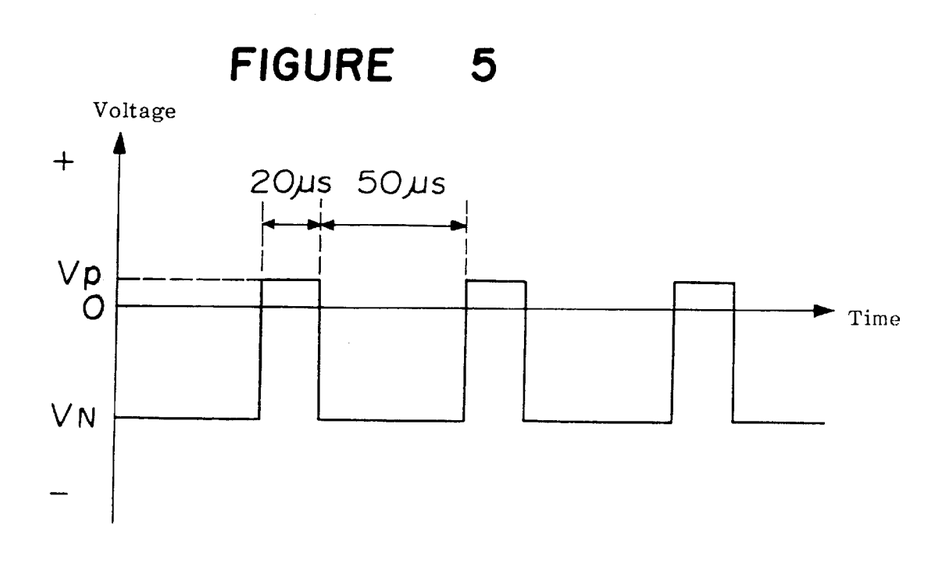
FIG. 5 is a graph showing a further voltage waveform of a sputtering power source to be used in the resent invention.

Further, as shown in FIG. 5, in a case where positive voltage $V_p$ is applied during the time when negative voltage $V_N$ is not applied, electrons in the plasma which have small mass will be drawn to the silicon target, whereby positive ions of nitrogen will be released more quickly than the case where the voltage is switched to 0.

At the same time, it is believed that when positive voltage is applied to the silicon target, positive ions of nitrogen are repelled from the silicon target and pushed towards the substrate by the Coulomb's force, whereby the nitriding reaction on the substrate is promoted.

The ratio in the number of atoms of nitrogen to silicon in the silicon nitride film is adjusted by adjusting the nitrogen concentration in the sputtering gas and/or by adjusting the supplied power to the silicon target, to form a silicon nitride film ideal from the stoichiometry, whereby most silicon atoms are bonded to nitrogen atoms by 4-coordination, while silicon-silicon bonds, nitrogen-nitrogen bonds or non-connected bonds of silicon and nitrogen atoms will not substantially be present, and accordingly, atomic level defects will decrease, and the alkali barrier property, the water permeation resistance and the oxidation resistance will be improved.

The substrate to be used in the present invention is not particularly limited. However, when the alkali barrier property of the silicon nitride film is expected, a substrate for a transparent electrode made of glass containing an alkali component such as soda lime glass, particularly a substrate for a liquid crystal display, may be mentioned as a suitable example, as mentioned above.

In a case where the water permeation resistance of the silicon nitride film is expected, a Low-E glass or a conductive glass having a silver layer, a magnetic disk having a magnetic layer, or a fluorophosphate glass filter for a charge coupled image pickup tube may be mentioned as a preferred example of the substrate.

Further, in a case where the oxidation resistance of the silicon nitride film is expected, a heat reflection glass having a metal or a metal nitride layer, a conductive glass having a transparent conductive layer, or a Low-E glass having a silver layer to which post-heat-treatment is to be applied, may be mentioned as a preferred example of the substrate.

Now, the present invention will be described in detail with reference to Examples. However, it should be understood that the present invention is by no means restricted by such specific Examples.

EXAMPLE 1

Using a usual magnetron sputtering apparatus as shown in FIG. 1, intermittent electric power having the voltage waveform as shown in FIG. 2 wherein $a_1$ is 100 $\mu$s and $b_1$ is 400 $\mu$s, was supplied to a tin oxide target 1 containing 5 wt % of antimony. As the substrate 2, a non-alkali glass sheet preliminarily heated to 300° C., was used.

Firstly, the sputtering chamber was evacuated to at most $1 \times 10^{-5}$ Torr. Then, argon gas containing 1 vol % of oxygen gas, was introduced to a gas pressure of 3×10$^{-3}$ Torr. The sputtering electric power was set so that the effective value would be 1.1 kW, and sputtering was continuously conducted for 23 hours, whereby formation of nodules, frequency of arcing and the properties of the tin oxide film were examined. The results are shown in Table 1.

EXAMPLE 2

Sputtering was continuously conducted for 23 hours in the same manner as in Example 1 except that intermittent electric power having the voltage waveform as shown in FIG. 4 wherein a$_3$ is 100 μs, the time b$_3$ for application of positive applied voltage V$_p$ at a level of about 10% of the negative applied voltage V$_N$ is 10 μs and b$_4$ is 390 μs, was supplied to a tin oxide target 1 containing 5 wt % of antimony, whereby formation of nodules, etc., were examined in the same manner as in Example 1. The results are shown in Table 1.

Comparative Example 1

Sputtering was continuously conducted for 23 hours in the same manner as in Example 1 except that DC voltage was applied to a tin oxide target 1 containing 5 wt % of antimony, whereby formation of nodules, etc. were examined in the same manner as in Example 1. The results are shown in Table 1.

EXAMPLES 3 AND 4
and
Comparative Example 2

Experiments of Examples 3 and 4 and Comparative Example 2 were conducted under the same conditions as in Examples 1 and 2 and Comparative Example 1, respectively, except that the tin oxide target containing 5 wt % of antimony, was changed to an indium oxide target containing 10 wt % of tin, whereby the examination was conducted in the same manner. The results are shown in Table 2.

EXAMPLES 5 AND 6
and
Comparative Example 3

Experiments of Examples 5 and 6 and Comparative Example 3 were conducted under the same conditions as in Examples 1 and 2 and Comparative Example 1, respectively, except that the tin oxide target containing 5 wt % of antimony, was changed to a zinc oxide target containing 5 wt % of gallium, whereby the examination was conducted in the same manner. The results are shown in Table 3.

In Example 1, Example 3 and Example 5, wherein intermittent electric power having the voltage waveform as shown in FIG. 2, was supplied, formation of nodules was very little, and no substantial decrease of the sputtering rate was observed even after the continuous sputtering for 23 hours (the target having a thickness of 6 mm was digged down completely). Further, the frequency of arcing decreased to a level of ⅕ as compared with the usual sputtering method represented by Comparative Example 1, 2 and 3, respectively.

The specific resistance of the respective transparent conductive films obtained in Examples 1, 3 and 5 was substantially the same as the sample obtained by usual sputtering.

In Examples 2, 4 and 6, wherein intermittent electric power having the voltage waveform as shown in FIG. 4, was supplied, formation of nodules was very little and no substantial decrease in the sputtering rate was observed even after the continuous sputtering for 23 hours. The frequency of arcing decreased to a level of ⅓ as compared with the Examples in which intermittent electric power having the voltage waveform as shown in FIG. 2, was supplied.

The specific resistance of the respective transparent conductive films obtained in Examples 2, 4 and 6 was substantially the same as the sample obtained by usual sputtering.

In Comparative Examples 1, 2 and 3, after the continuous sputtering for 23 hours of 6 mm was a large amount of black nodules were observed over the entire erosion region except for the erosion center of the target where the sputtering electric power was concentrated, and frequency of arcing was very high at a level of 15 times per minute or more. The decrease of the sputtering rate was substantial by at least 40%.

The initial specific resistance of the respective transparent conductive films obtained in Comparative Examples 1, 2 and 3 deteriorates upon expiration of 23 hours due to the decrease of the sputtering rate. The nodules formed at that time were very firm, and it was necessary to conduct mechanical abrasion cleaning.

TABLE 1

| | Example 1 | Example 2 | Comparative Example 1 |
|---|---|---|---|
| Formation of nodules (after sputtering for 23 hours) | Almost nil | Almost nil | Many nodules were observed over the entire erosion region except for the erosion center |
| Frequency of arcing (after sputtering for 23 hours) | About 3 times/min | Once/min or less | 15 times/min or more |
| Specific resistance of the tin oxide film (Ωcm) | | | |
| Immediately after initiation of sputtering | 1.0 × 10$^{-3}$ | 1.0 × 10$^{-3}$ | 1.0 × 10$^{-3}$ |
| After sputtering for 23 hours | 1.0 × 10$^{-3}$ | 1.0 × 10$^{-3}$ | 2.0 × 10$^{-3}$ |
| Change in the deposition rate (after sputtering for 23 hours) | Almost nil | Almost nil | Decreased by 40% |

TABLE 2

| | Example 3 | Example 4 | Comparative Example 2 |
|---|---|---|---|
| Formation of nodules (after sputtering for 23 hours) | Almost nil | Almost nil | Many nodules were observed over the entire erosion region except for the erosion center |
| Frequency of arcing (after sputtering for 23 hours) | About 3 times/min | Once/min or less | 15 times/min or more |
| Specific resistance of the indium oxide film (Ωcm) | | | |
| Immediately after initiation of sputtering | 1.9 × 10$^{-4}$ | 1.9 × 10$^{-4}$ | 1.9 × 10$^{-4}$ |
| After sputtering for 23 hours | 2.0 × 10$^{-4}$ | 2.0 × 10$^{-4}$ | 4.0 × 10$^{-4}$ |
| Change in the deposition rate (after sputtering for 23 hours) | Almost nil | Almost nil | Decreased by 40% |

TABLE 3

|  | Example 5 | Example 6 | Comparative Example 3 |
|---|---|---|---|
| Formation of nodules (after sputtering for 23 hours) | Almost nil | Almost nil | Many nodules were observed over the entire erosion region except for the erosion center |
| Frequency of abnormal discharge (after sputtering for 23 hours) | About 3 times/min | Once/min or less | 15 times/min or more |
| Specific resistance of the tin oxide film ($\Omega$cm) | | | |
| Immediately after initiation of sputtering | $3.0 \times 10^{-4}$ | $3.0 \times 10^{-4}$ | $3.0 \times 10^{-4}$ |
| After sputtering for 23 hours | $3.0 \times 10^{-4}$ | $3.0 \times 10^{-4}$ | $5.0 \times 10^{-4}$ |
| Change in the deposition rate (after sputtering for 23 hours) | Almost nil | Almost nil | Decreased by 40% |

Now, Examples for silicon oxide films having an alkali barrier property will be presented.

EXAMPLE 7

Figure 7:
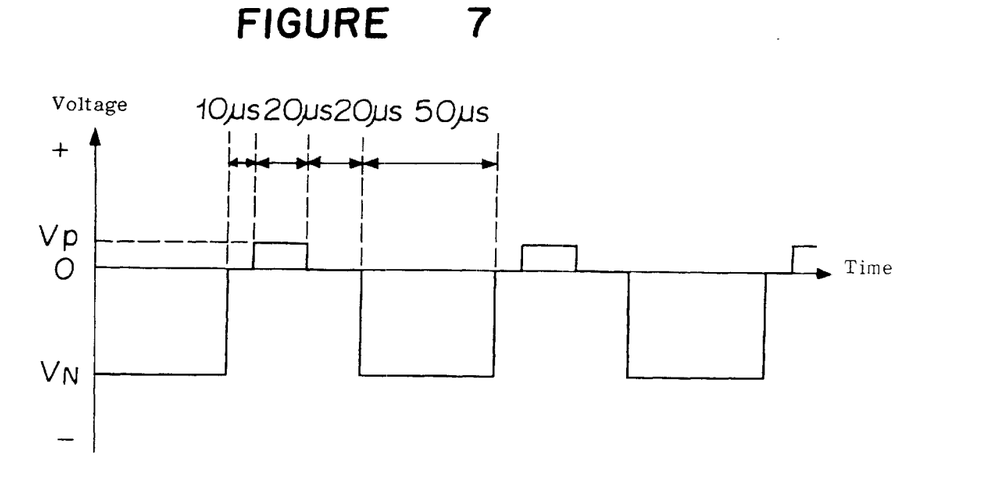
FIG. 7 is a graph showing another voltage waveform of a sputtering power source to be used in the present invention.

In a vacuum chamber, N-type silicon (phosphorus-doped single crystal) having a specific resistance of 1.2 $\Omega$cm was placed as a target on a cathode, and a soda lime glass sheet was placed as a substrate facing to the target. The vacuum chamber was evacuated to $1 \times 10^{-5}$ Torr. Then, a gas mixture of argon and oxygen was introduced as sputtering gas, and conductance was adjusted so that the pressure would be $2 \times 10^{-3}$ Torr. Then, the voltage as shown in FIG. 7 was applied to the cathode. Here, the negative voltage ($V_N$) was adjusted so that the supplied electric power during application of this voltage would be 500 W.

The oxygen concentration in the sputtering gas was adjusted to 20%, 40%, 60%, 80% or 100%, and while adjusting the deposition time so that the thickness of each film would be 25 nm, a thin film composed mainly of silicon oxide was formed on a soda lime glass substrate. The substrate temperature was maintained to be at room temperature, and no heating was carried out. The coated side of the glass substrate thus obtained was contacted with pure water at 90° C. for 24 hours, whereupon the amount of sodium (Na atoms) out diffused into this pure water was measured by atomic absorptiometry. The results are shown in Table 4.

TABLE 4

| Concentration of oxygen gas | 20% | 40% | 60% | 80% | 100% |
|---|---|---|---|---|---|
| The amount of out diffused Na ($\mu$g/cm$^2$) | 0.09 | 0.08 | 0.02 | 0.02 | 0.03 |

Comparative Example 4

In the same manner as in Example 7, a silicon target and a soda lime glass substrate were set in a vacuum chamber. Then, sputtering deposition was conducted by applying a radio frequency voltage of 13.56 MHz to the cathode. The substrate temperature was maintained at room temperature, and the oxygen concentration in the sputtering gas was 60%. The deposition time was adjusted so that the thickness of the film would be 25 nm. In the same manner as in Example 7, the amount of out diffused Na was measured and found to be 0.32 $\mu$g/cm$^2$.

Now, Examples for silicon nitride films having an alkali barrier property will be given.

EXAMPLES 8 AND 9 and

Comparative Example 5 to 7

Firstly, soda lime silicate glass sheets were prepared as substrates. Then, on these substrates, silicon nitride films were formed under the conditions as specified in the following Examples 8 and 9 and Comparative Examples 5 to 7.

EXAMPLE 8

N-type silicon having a specific resistance of 1.2 $\Omega$·cm and having an area of 160 mm×40 mm, was used as the target, and voltage having the waveform as shown in FIG. 5, was applied thereto.

Here, negative voltage $V_N$ was set so that the applied electric power during the application would be 200 W, and positive voltage $V_p$ was set to be 100 V.

As the sputtering gas, a gas mixture of nitrogen gas and argon gas, was used. With respect to each case where the nitrogen concentration was 20%, 40%, 50%, 80% or 100%, a silicon nitride film was formed with a film thickness of 200 Å.

EXAMPLE 9

A silicon nitride film was formed in the same manner as in Example 8 except that voltage with the waveform as shown in FIG. 6 was applied, and the nitrogen concentration was adjusted to be 40%.

Comparative Example 5

A silicon nitride film was formed with a film thickness of 200 Å in the same manner as in Example 8 except that DC voltage set so that the electric power would be 200 W, was, applied, with respect to each case where the nitrogen concentration in the sputtering gas was 20%, 40%, 50%, 80% or 100%.

Comparative Example 6

N-type silicon having a specific resistance of 1.5 $\Omega$·cm and having a diameter of 6 inch, was used as the target, and a radio frequency of 13.56 MHz set so that the electric power would be 300 W, was applied thereto. The nitrogen concentration in the sputtering gas was adjusted to be 100%, and a silicon nitride film was formed with a film thickness of 200 Å on a substrate at room temperature.

Comparative Example 7

With respect to each case where the NH$_3$/SiH$_4$ ratio in the raw material gas is 3 or 5, a silicon nitride film was formed with a film thickness of 200 Å on a substrate maintained at a temperature of about 600° C. by a CVD method.

Figure 8:
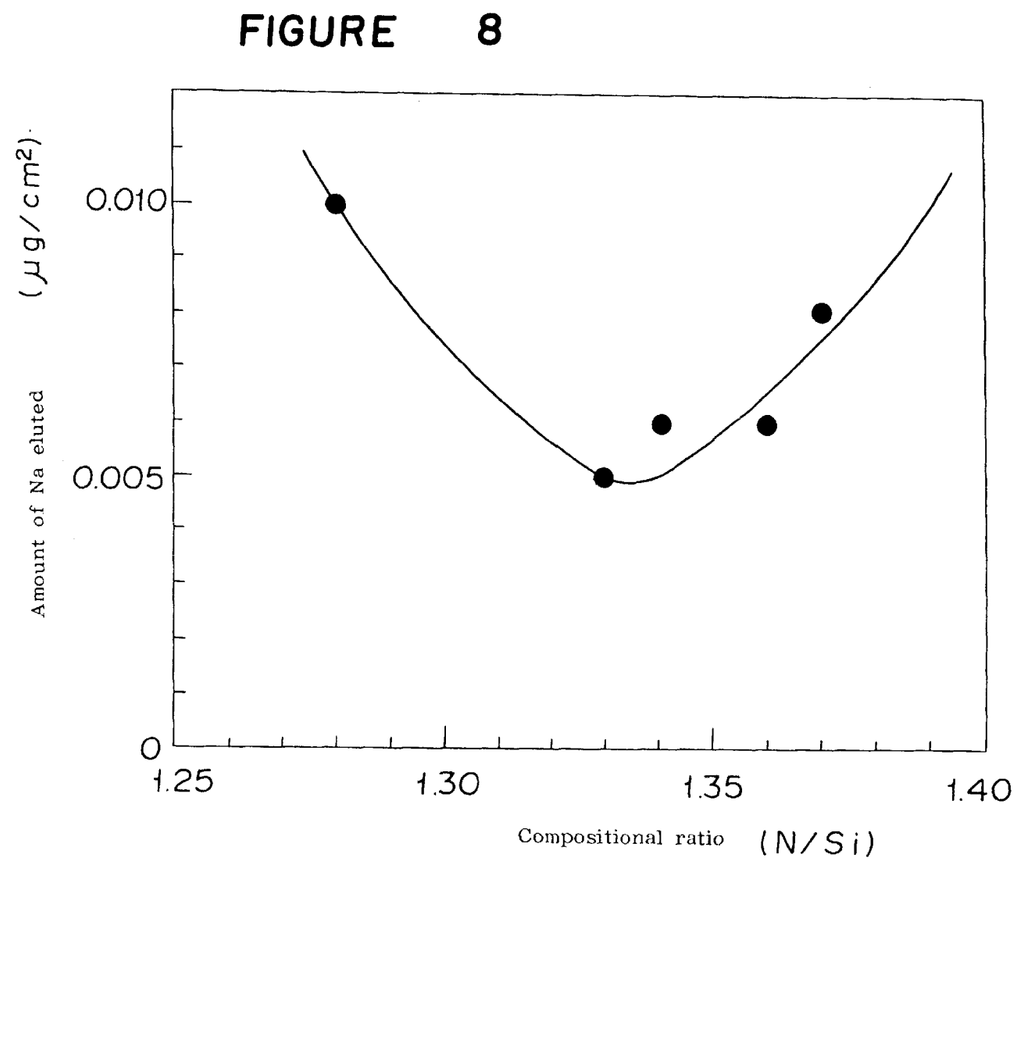
FIG. 8 is a graph showing the relation between the composition (N/Si ratio) of a silicon nitride film and the amount of Na atoms out-diffused.

The composition (N/Si ratio) of the silicon nitride film obtained in each of Examples 8 and 9 and Comparative Examples 5 to 7 was measured by X-ray photoelectron spectroscopy. Then, to evaluate the alkali barrier property, it was immersed in a pure water of 90° C. for 24 hours, whereupon the amount of Na atoms out diffused from the soda lime silicate glass through the silicon nitride film, was obtained. The results thereby obtained are shown in Tables 5 and 6. Further, the relation between the composition (N/Si ratio) of the silicon nitride film obtained in Example 8 and the amount of out diffused Na atoms eluted, is shown in FIG. 8.

TABLE 5

|  | Nitrogen concentration (%) | Composition of the film (N/Si) | Amount of out diffused Na ($\mu g/cm^2$) |
| --- | --- | --- | --- |
| Example 8 | 20 | 1.28 | 0.010 |
|  | 40 | 1.33 | 0.005 |
|  | 50 | 1.34 | 0.006 |
|  | 80 | 1.36 | 0.006 |
|  | 100 | 1.37 | 0.008 |
| Example 9 | 40 | 1.33 | 0.006 |
| Comparative Example 5 | 20 | 1.26 | 0.014 |
|  | 40 | 1.33 | 0.008 |
|  | 50 | 1.34 | 0.010 |
|  | 80 | 1.35 | 0.013 |
|  | 100 | 1.36 |  |
| Comparative Example 6 | 100 | 1.36 | 0.015 |

TABLE 6

|  | $NH_3/SiH_4$ | Composition of the film (N/Si) | Amount of out diffused Na ($\mu g/cm^2$) |
| --- | --- | --- | --- |
| Comparative Example 7 | 3 | 1.27 | 0.047 |
|  | 5 | 1.36 | 0.038 |

As compared with conventional DC sputtering (Comparative Example 5), radio frequency sputtering (Comparative Example 6) or CVD (Comparative Example 7), the method of the present invention is capable of providing excellent silicon nitride films having an alkali barrier property constantly with little change in the properties even when the deposition conditions for the composition of films are changed to some extents.

EXAMPLE 10

On a soda lime silicate glass sheet, a silicon nitride film ($SiN_x$) was formed in a thickness of 200 Å. Then, ITO was formed in a film thickness of 2,600 Å to obtain a glass substrate provided with a transparent electrode.

In the deposition of the silicon nitride film, N-type silicon having a specific resistance of 1.3Ω·cm and having an area of 432 mm×127 mm, was used as the target, and voltage having the waveform as shown in FIG. 5, was applied thereto.

Here, the negative voltage $V_N$ was set so that the applied electric power during the application would be 1 kW, and the positive voltage $V_p$ was set to be 50 V.

As the sputtering gas, a gas mixture of nitrogen and argon, was used, and in the same manner as in Example 8, the nitrogen concentration was changed from 20 to 100%.

Comparative Example 8

A silicon nitride film was formed, and a glass substrate provided with a transparent electrode, was obtained in the same manner as in Example 10 except that a gas mixture of nitrogen and argon having a nitrogen concentration of 40%, was used as the sputtering gas, and a DC voltage set so, that the electric power would be 1 kW, was applied.

Each of the obtained glass substrates provided with transparent electrodes was placed in an air atmosphere at 600° C. for one hour and then a SIMS (secondary ion mass spectroscopy) analysis was carried out to determine the depth profile of sodium diffused into ITO and to determine the penetration depth of sodium into ITO. For the determination of the penetration depth, the point where the count rate of sodium became constant, a background level, was taken.

In Example 10, the penetration depths of sodium into ITO in the cases where the nitrogen concentration was 20, 40, 50, 80 and 100%, were 660, 590, 600, 600 and 630 Å, respectively.

On the other hand, in the case of Comparative Example 8, the penetration depth was 630 Å. The penetration depth of sodium into ITO is preferably at most 600 Å for the practical purpose. In Example 10, preferred results were obtained in the cases-where the nitrogen concentration was 40, 50 and 80% i.e. in the case where the composition (N/Si) of the film is from 1.30 to 1.36, from FIG. 8.

EXAMPLE 11

A liquid crystal display cell was prepared as follows. On a soda lime silicate glass sheet, a silicon oxide film ($SiO_2$) was formed in a thickness of 200 Å by a CVD method, and then a color filter (CF) and an acrylic protective layer (OP) were formed. Then, a silicon nitride film (SiNx) was formed in a thickness of 200 Å.

In the deposition of the silicon nitride film, N-type silicon having a specific resistance of 1.3Ω·cm and having a area of 432 mm×127 mm, was used as the target, and voltage having the waveform as shown in FIG. 5, was applied thereto.

Here, the negative voltage $V_N$ was set so that the applied electric power during the application would be 1 kW, and the positive voltage $V_p$ was set to be 50 V.

As the sputtering gas, a gas mixture of nitrogen and argon having a nitrogen concentration of 30%, was used.

Then, ITO was formed in a film thickness of 2,600 Å, and polyimide (OC) was over-coated thereon.

On the other hand, on another soda lime silicate glass sheet, $SiN_x$ was formed in the same manner as above in a film thickness of 200 Å, and ITO was then formed in a film thickness of 2,600 Å. Then, polyimide (OC) was over-coated thereon.

These two glass sheets were put together with the respective polyimide layers facing to each other, to form a cell, and liquid crystal was injected therebetween. The construction of this cell is as shown by the following formula 1:

Comparative Example 9

A silicon nitride film was formed in the same manner as in Example 11 except that a DC voltage set so that the electric power would be 1 kW, was applied, and a liquid crystal display cell was obtained.

Each of the obtained cells was placed in an atmosphere with a relative humidity of 90% and a temperature of 80° C., whereby the change with time of the specific resistance of liquid crystal was examined. In the case of Example 11, the specific resistance of liquid crystal immediately after being assembled in the cell, was $2.5 \times 10^{11}$Ω·cm, and 200 hours later, it became $0.8 \times 10^{-11}$ Ω·cm. Whereas, in Comparative Example 9, the specific resistance of liquid crystal immediately after being assembled into the cell was $2.3 \times 10^{11}$Ω·cm, and 200 hours later, it became $0.5 \times 10^{11}$Ω·cm.

Thus, with the silicon nitride film having an excellent alkali barrier property formed by the present invention, the change in the specific resistance of liquid crystal in the cell can be minimized.

Now, Examples for silicon nitride films having water permeation resistance will be given.

On soda lime glass sheets, silicon nitride films were formed under the conditions shown in the following Examples 12 and 13 and Comparative Examples 10 to 12, respectively.

EXAMPLE 12

In the same manner as in Example 8 for a silicon nitride film having an alkali barrier property, a silicon nitride film was formed in a thickness of 500 Å with respect to each of cases where the nitrogen concentration in the sputtering gas was 20%, 40%, 50%, 80% and 100%.

EXAMPLE 13

A silicon nitride film was formed a thickness of 500 Å in the same manner as in Example 9 for a silicon nitride film having an alkali barrier property.

Comparative Example 10

In the same manner as in Comparative Example 5 for a silicon nitride film having an alkali barrier property, a silicon nitride film was formed in a thickness of 500 Å with respect to each of cases where the nitrogen concentration in the sputtering gas was 20%, 40%, 50%, 80% and 100%.

Comparative Example 11

A silicon nitride film was formed in a thickness of 500 Å in the same manner as in Comparative Example 6 for a silicon nitride film having an alkali barrier property.

Comparative Example 12

A silicon nitride film was formed in a thickness of 500 Å by a CVD method while maintaining the temperature at about 600° C. in the same manner as in Comparative Example 7 for a silicon nitride film having an alkali barrier property.

The compositions (N/Si ratios) of the silicon nitride films obtained in Examples 12 and 13 and Comparative Examples 10 to 12 were measured by X-ray photoelectron spectroscopy. Then, to evaluate the water penetration resistance, each sample was placed in heavy water at 60° C. for 6 days. Then, the mass spectrometry (secondary ion mass spectroscopy: SIMS) analysis was carried out to determine the depth profile of deuterium in the film, and from the obtained distribution of deuterium, the depth where the count rate of deuterium became 1/10 of the maximum count rate, was taken as the penetration depth of water.

Figure 9:
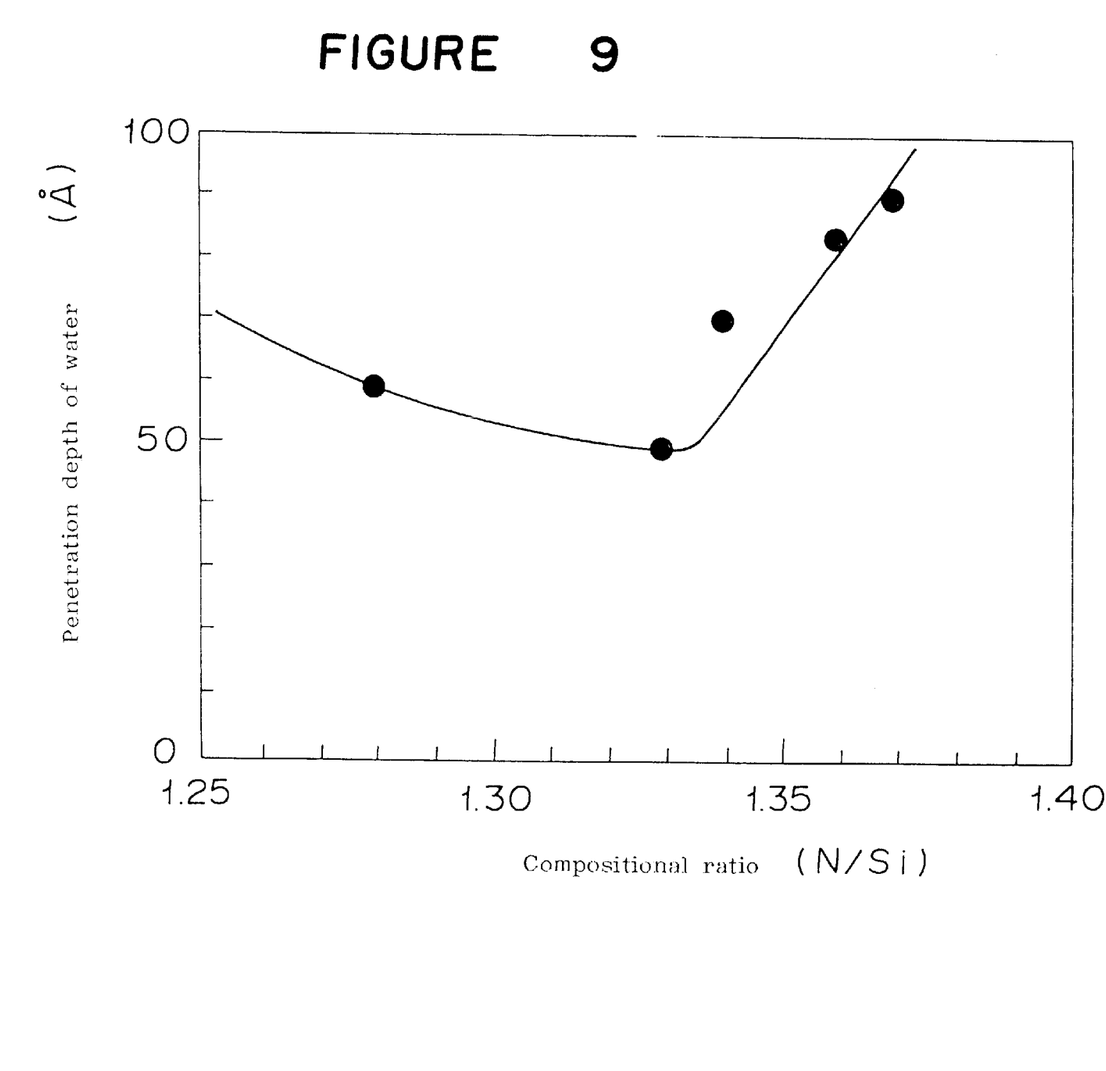
FIG. 9 is a graph showing the relation between the composition (N/Si ratio) of a silicon nitride film and the penetration depth of water.

The obtained results are shown in Tables 7 and 8. Further, the relation between the composition (N/si ratio) of the silicon nitride film obtained in Example 12 and the penetration depth of water, is shown in FIG. 9.

TABLE 7

|  | Nitrogen concentration (%) | Composition of the film (N/Si) | Penetration depth of water (Å) |
|---|---|---|---|
| Example 12 | 20 | 1.28 | 59 |
|  | 40 | 1.33 | 50 |
|  | 50 | 1.34 | 71 |
|  | 80 | 1.36 | 85 |
|  | 100 | 1.37 | 91 |
| Example 13 | 40 | 1.33 | 52 |

TABLE 7-continued

|  | Nitrogen concentration (%) | Composition of the film (N/Si) | Penetration depth of water (Å) |
|---|---|---|---|
| Comparative Example 10 | 20 | 1.26 | 61 |
|  | 40 | 1.33 | 54 |
|  | 50 | 1.34 | 73 |
|  | 80 | 1.35 | 86 |
|  | 100 | 1.36 | 93 |
| Comparative Example 11 | 100 | 1.36 | 91 |

TABLE 8

|  | $NH_3/SiH_4$ | Composition of the film (N/Si) | Penetration depth of water (Å) |
|---|---|---|---|
| Comparative Example 12 | 3 | 1.27 | 138 |
|  | 5 | 1.36 | 89 |

As compared with conventional DC sputtering (Comparative Example 10), radio frequency sputtering (Comparative Example 11) or CVD (Comparative Example 12), the method of the present invention is capable of providing silicon nitride films excellent in the water permeation resistance constantly with little change in the properties even when the deposition conditions or the composition of the film changes to some extents.

EXAMPLE 14

By a sputtering method, Low-E glass as shown by the formula 2, was prepared. Then, in the same manner as in Example 10 for a silicon nitride film having alkali barrier property except that the positive voltage $V_p$ was set to be 100 V, a silicon nitride film was formed in a thickness of 200 Å with respect to each of cases where the nitrogen concentration in the sputtering gas was 20, 40, 50, 80 and 100%.

Comparative Example 13

A silicon nitride film of 200 Å was formed on a Low-E glass in the same manner as in Example 14 except that a gas mixture of nitrogen and argon having a nitrogen concentration of 40%, was used as the sputtering gas, and the sputtering condition of Comparative Example 8 for a silicon nitride film having an alkali barrier property was used as the sputtering condition.

The Low-E glass provided with a silicon nitride film obtained in each of Example 14 and Comparative Example 13, was placed in atmospheric air under a relative humidity of 95% at a temperature of 50° C. for 650 hours, whereby the change in the transmittance of visible light was measured.

In Example 14, in the case where the nitrogen concentration was 20, 40, 50, 80 or 100%, the transmittance was 67.2% immediately after the deposition, but after the above treatment, it was 67.8, 67.2, 68.3, 69.4 or 69.9%, respectively. On the other hand, in Comparative Example 13, the transmittance was 67.2% immediately after the deposition, and after the above treatment, it was 67.3%.

When compared under the condition where the nitrogen concentration is equal, it is evident that the Low-E glass according to the present invention is superior in the durability, since the change in the transmittance of visible light is less.

For the practical purpose, the change in the transmittance of visible light after the treatment is preferably within 2%. In Example 14, preferred results were obtained in the cases where the nitrogen concentration was 20, 40 and 50%, i.e. in the cases where the composition (N/Si) of the film is from 1.25 to 1.35 from FIG. 9.

Glass/ZnO(160 Å)/Ag(90 Å)/Ti(10 Å)/ZnO(380 Å)  Formula 2

Now, Examples for silicon nitride films having an oxidation resistance will be given.

On soda lime glass sheets, silicon nitride films were formed under the conditions as shown in the following Examples 15 and 16 and Comparative Examples 14 to 16, respectively.

EXAMPLE 15

In the same manner as in Example 8 for a silicon nitride film having an alkali barrier property, a silicon nitride film was formed in a thickness of 500 Å with respect to each of cases where the nitrogen concentration in the sputtering gas was 20%, 40%, 50%, 80% and 100%.

EXAMPLE 16

A silicon nitride film was formed in a thickness of 500 Å in the same manner as in Example 9 for a silicon nitride film having an alkali barrier property.

Comparative Example 14

In the same manner as in Comparative Example 5 for a silicon nitride film having an alkali barrier property, a silicon nitride film was formed in a film thickness of 500 Å with respect to each of cases where the nitrogen concentration in the sputtering gas was 20%, 40%, 50%, 80% and 100%.

Comparative Example 15

A silicon nitride-film was formed in a film thickness of 500 Å in the same manner as in Comparative Example 6 for a silicon nitride film having an alkali barrier property.

Comparative Example 16

A silicon nitride film was formed in a film thickness of 500 Å by a CVD method while maintaining the temperature at about 600° C. in the same manner as in Comparative Example 7 for a silicon nitride film having an alkali barrier property.

The composition (N/Si ratio) of the silicon nitride film obtained in each of Examples 15 and 16 and Comparative Examples 14 to 16, was measured by X-ray photoelectron spectrometry. Then, to evaluate the oxidation resistance, each sample was placed in atmospheric air at 1,000° C. for 3 hours, and then distribution in the X-ray photoelectron spectroscopy was carried out to determine the depth profile of oxygen in the film. From the obtained oxygen distribution, the depth at which the X-ray photoelectron intensity of oxygen atoms became one half of the X-ray photoelectron intensity of oxygen atoms at the surface, was taken as the thickness of the oxidized layer.

Figure 10:
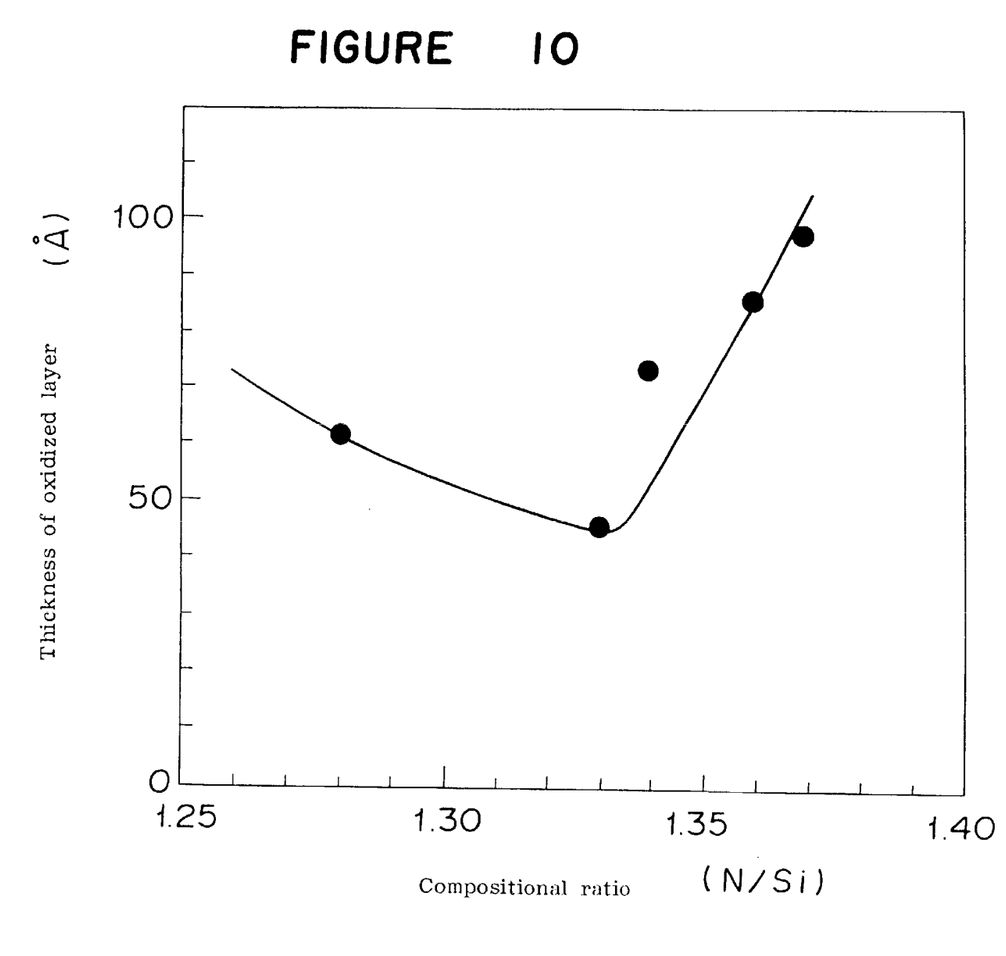
FIG. 10 is a graph showing the relation between the composition (N/Si ratio) of a silicon nitride film and the thickness of the oxidized layer.

The obtained results are shown in Tables 9 and 10. Further, the relation between the composition (N/Si ratio) of the silicon nitride film obtained in Example 15 and the thickness of the oxidized layer, is shown in FIG. 10.

TABLE 9

|  | Nitrogen concentration (%) | Composition of the film (N/Si) | Thickness of the oxidized layer |
|---|---|---|---|
| Example 15 | 20 | 1.28 | 62 |
|  | 40 | 1.33 | 57 |
|  | 50 | 1.34 | 74 |
|  | 80 | 1.36 | 87 |
|  | 100 | 1.37 | 98 |
| Example 16 | 40 | 1.33 | 58 |
| Comparative Example 14 | 20 | 1.26 | 66 |
|  | 40 | 1.33 | 59 |
|  | 50 | 1.34 | 77 |
|  | 80 | 1.35 | 89 |
|  | 100 | 1.36 | 100 |
| Comparative Example 15 | 100 | 1.36 | 107 |

TABLE 10

|  | $NH_3/SiH_4$ | Composition of the film (N/Si) | Thickness of the oxidized layer |
|---|---|---|---|
| Comparative Example 16 | 3 | 1.27 | 146 |
|  | 5 | 1.36 | 99 |

As compared with conventional DC sputtering (Comparative Example 14), radio frequency sputtering (Comparative Example 15) or CVD (Comparative Example 16), the method of the present invention is capable of providing a silicon nitride film excellent in the oxidation resistance constantly with little change in the properties even when the deposition conditions or the composition of the film changes to some extents.

EXAMPLE 17

Using a tin target having an area of 432 mm×127 mm and a gas mixture of oxygen and argon having an oxygen concentration of 50%, as the sputtering gas, a tin oxide film was formed in a thickness of 200 Å on a soda lime silicate glass sheet having a thickness of 2 mm at room temperature by applying negative voltage so that the supplied electric power would be 1.2 kW by DC sputtering.

Then, using a gas mixture of nitrogen and argon having a nitrogen concentration of 40% as the sputtering gas, a silicon nitride film was formed in a thickness of 50 Å by applying voltage of the waveform as shown in FIG. 5 to a N-type silicon target having a specific resistance of 1.3Ω·cm and having the same size of the above tin target.

Here, the negative voltage ($V_N$) was set so that the supplied electric power under the application of the negative voltage would be 1 kW, and the positive voltage ($V_P$) was maintained to be 50 V.

Further, using a gas mixture of nitrogen and argon having a nitrogen concentration of 10% as the sputtering gas, a chromium nitride film was formed in a thickness of 200 Å by DC sputtering with supplied power of 1 kW to a chromium target having the same size as the tin target.

Thereafter, in the same manner as above, 80 Å of a silicon nitride film and 500 Å of a tin oxide film were sequentially formed to obtain a heat reflection glass as shown by the Formula 3.

Glass/SnO$_2$(200 Å)/SiN$_x$(50 Å)/CrN$_x$(200 Å)/SiN$_x$(80 Å)/SnO$_2$(500 Å)  Formula 3

Comparative Example 17

A heat reflecting glass as shown by the Formula 3 was prepared in the same manner as in Example 17 except that the application: to the target in the deposition of the silicon nitride film was changed to the application of negative DC voltage so that the supplied electric power would be 1 kW.

The heat reflecting glass obtained in each of Example 17 and Comparative Example 17 was heated in atmospheric air from room temperature to 630° C. over a period of two hours, and after maintaining it at 630° C. for 5 minutes, the temperature was lowered to about 150° C. over a period of two hours. This heat treatment condition corresponds to the condition for bending sheet glass.

With respect to each heat reflecting glass before and after the heat treatment, the visible light transmittance, the visible light reflectance and the color difference resulted from the heat treatment were measured. The results are shown in Table 11. The visible light transmittance and the visible light reflectance were measured in accordance with JIS R 3106-1985, and the color difference was determined by the L*u*v* color chart of CIE 1976.

TABLE 11

|  | Visible light transmittance | Visible light reflectance on the film side | Visible light reflectance on the glass side |
| --- | --- | --- | --- |
| Example 17 |  |  |  |
| Before heating | 15.7% | 12.7% | 42.2% |
| After heating | 15.8% | 12.2% | 43.2% |
| Color difference | 2.3 | 2.2 | 0.8 |
| Comparative Example 17 |  |  |  |
| Before heating | 15.7% | 12.8% | 42.2% |
| After heating | 15.9% | 12.2% | 43.2% |
| Color difference | 2.5 | 2.4 | 1.0 |

It is thus apparent that the heat reflecting glass according to the present invention is superior in the durability, since the change in the visible light transmittance, the change in the visible light reflectance and the color difference are little.

In Example 17, the experiment was conducted in the same manner by changing the nitrogen concentration to 20, 50, 80 and 100%. From the results, the relation between the color difference in the transmission and the nitrogen concentration may be summarized such that when the nitrogen concentration was 20, 40, 50, 80 and 100%, the color difference was 2.6, 2.3, 2.8, 3.1 and 3.4, respectively.

For the practical purpose, the color difference is preferably at most 3. In Example 17, preferred results were obtained in the cases where the nitrogen concentration was 20, 40 and 50%, i.e. in the cases where the composition (Ni/Si) of the film was from 1.25 to 1.35 from FIG. 10.

EXAMPLE 18

A heat reflecting glass as shown by the Formula 4 was prepared by sequential deposition of the various films on a soda lime silicate glass having a thickness of 2 mm using the same target and sputtering condition as in Example 17.

Glass/SiN$_x$(50 Å)/CrN$_x$(200 Å)/SiN$_x$(80 Å)/SnO$_2$ (500 Å)   Formula 4

Comparative Example 18

A heat reflecting glass as shown by the Formula 4 was prepared in the same manner as in Example 18 except that the application to the target in the deposition of the silicon nitride film was changed to the application of negative DC voltage so that the supplied electric power would be 1 kW.

The heat reflecting glass obtained in each of Example 18 and Comparative Example 18, was subjected to heat treatment in atmospheric air at 650° C. for 6 minutes and 40 seconds. This heat treatment corresponds to the condition for reinforcing sheet glass.

With respect to each heat reflecting glass before and after the heat treatment, the visible light transmittance, the visible light reflectance and the color difference resulted from the heat treatment were measured in the same manner in Example 17 and Comparative Example 17. The results are shown in Table 12.

TABLE 12

|  | Visible light transmittance | Visible light reflectance on the film side | Visible light reflectance on the glass side |
| --- | --- | --- | --- |
| Example 18 |  |  |  |
| Before heating | 10.0% | 20.2% | 45.0% |
| After heating | 10.8% | 18.4% | 44.2% |
| Color difference | 1.5 | 3.2 | 0.9 |
| Comparative Example 18 |  |  |  |
| Before heating | 10.1% | 20.2% | 44.9% |
| After heating | 11.0% | 18.6% | 44.0% |
| Color difference | 1.8 | 3.4 | 1.0 |

From the above results, it is evident that with the heat reflecting glass having a silicon nitride film according to the present invention, the changes in the visible light transmittance and in the visible light reflectance due to the heating and the color difference resulted from the heat treatment were small as compared with the conventional heat reflecting glass having a silicon nitride film formed by DC sputtering. Namely, the present invention is suitable for a heat reflecting glass which is subjected to post heating such as bending treatment or reinforcing treatment.

EXAMPLE 19

On a quartz glass sheet, a silicon nitride film, an ITO film and a silicon nitride film were sequentially deposited at room temperature to obtain a heat reflecting glass as identified by the Formula 5. The deposition condition for the silicon nitride film was the same as the deposition condition for a silicon nitride film in Example 17. The ITO film was formed by DC sputtering so that the supplied electric power would be 1.2 kW using an ITO target and a gas mixture of oxygen and argon having an oxygen concentration of 2% as the sputtering gas.

Quartz glass/SiN$_x$(250 Å)/ITO(2500 Å)/SiN$_x$(250 Å)   Formula 5

Comparative Example 19

A heat reflecting glass as represented by the Formula 5 was prepared in the same manner as in Example 19 except that the application to the target in the deposition of the silicon nitride film was changed to the application of negative DC voltage so that the supplied electric power would be 1 kW.

The heat reflecting glass obtained in each of Example 19 and Comparative Example 19 was subjected to heat treatment in atmospheric air at 600° C. for one hour.

With respect to each heat reflecting glass before and after the heating, the reflectance at a wavelength of 2,000 nm and the specific resistance of the ITO layer were measured. The results are shown in Table 13.

TABLE 13

| | Reflectance at a wavelength of 2,000 nm | Specific resistance of the ITO layer |
|---|---|---|
| Example 19 | | |
| Before heating | 0.77 | $1.30 \times 10^{-4}\ \Omega \cdot cm$ |
| After heating | 0.77 | $1.26 \times 10^{-4}\ \Omega \cdot cm$ |
| Comparative Example 19 | | |
| Before heating | 0.77 | $1.30 \times 10^{-4}\ \Omega \cdot cm$ |
| After heating | 0.76 | $1.32 \times 10^{-4}\ \Omega \cdot cm$ |

From the above results, it is evident that with the heat reflecting glass having a silicon nitride film according to the present invention, the change in the reflectance of the infrared radiation at a wavelength of 2,000 nm before and after the heating, is small as compared with the conventional heat reflecting glass having a silicon nitride film prepared by DC sputtering. Namely, the present invention is suitable also for the window of an electric oven or microwave oven.

As described in the foregoing, according to the present invention, a transparent conductive film can be formed without stopping the sputtering process which leads to a decrease of the productivity, and formation of nodules of sub oxides on the target surface, which leads to a decrease of the sputtering rate, can be suppressed. At the same time, arcing which leads to defects of the transparent conductive film, can be suppressed.

By the above effect of the suppressing arcing, it has been made possible to supply large electric power as compared with the conventional DC sputtering method, and it is thereby possible to attain a high deposition rate. Further, according to the present invention, arcing can be suppressed without adding a circuit for preventing arcing which is commonly used for a power source for DC sputtering.

Further, the sputtering condition can be controlled in the same manner as the conventional DC sputtering by a simple method of controlling the effective value of intermittently supplied electric power, whereby a transparent conductive film having equal properties to the conventional product, can be obtained.

As is apparent from the above results, according to the present invention, a silicon oxide film having a high alkali barrier property can be obtained stably without heating the substrate.

Further, according to the present invention, it is possible to obtain a silicon nitride film having high alkali barrier property, water permeation resistance and oxidation resistance stably without heating the substrate.

Furthermore, since it is possible to form a silicon nitride film having a high alkali barrier property without heating the substrate, such an alkali barrier coating can be conducted also on a substrate having a relatively low heat resistance.

Further, deposition is conducted by intermittent DC sputtering, formation of a film with a large area or film formation at a high speed can be facilitated, whereby application to e.g. a transparent conductive substrate for liquid crystal can be made possible on an industrial production scale.

What is claimed is:

1. A method for producing a transparent conductive film composed mainly of an oxide by sputtering using a sputtering target capable of forming a transparent conductive film, said method including the step of supplying intermittent electric power to the target, said intermittent electric power having a voltage waveform whereby the application time of negative voltage is within a range of from 10 microseconds to 10 milliseconds, and the time when no negative voltage is applied is within a range from 10 microseconds to 100 milliseconds and wherein the average value of the intermittent electric power is from 2 to 10 times the average value of the electric power per period.

2. The method according to claim 1, wherein the sputtering target is composed mainly of tin or tin oxide.

3. The method according to claim 2, wherein the sputtering target contains metal antimony or an antimony compound.

4. The method according to claim 1, wherein the sputtering target is composed mainly of indium or indium oxide.

5. The method according to claim 4, wherein the sputtering target contains tin.

6. The method according to claim 1, wherein the sputtering target is composed mainly of zinc or zinc oxide.

7. The method according to claim 6, wherein the sputtering target contains a simple substance or a compound of at least one metal selected from the group consisting of aluminum, gallium, indium, boron and silicon.

8. The method according to claim 1, wherein the average value of the intermittent electric power density is from 2.5 $W/cm^2$ to 30 $W/cm^2$.

9. The method according to any one of claims 1 to 7, wherein a sputtering rate is controlled by the average value of the electric power per period.

* * * * *